(12) United States Patent
Schmidt

(10) Patent No.: US 6,867,598 B2
(45) Date of Patent: Mar. 15, 2005

(54) METHOD FOR MEASURING FAULT LOCATIONS IN HIGH FREQUENCY CABLES AND LINES

(75) Inventor: Rolf Schmidt, Melsungen (DE)

(73) Assignee: T-Mobile Deutschland GmbH, Bonn (DE)

(*) Notice: Subject to any disclaimer, the term of this patent is extended or adjusted under 35 U.S.C. 154(b) by 0 days.

(21) Appl. No.: 10/311,443

(22) PCT Filed: Jun. 13, 2001

(86) PCT No.: PCT/DE01/02170
§ 371 (c)(1), (2), (4) Date: Mar. 26, 2003

(87) PCT Pub. No.: WO01/96887
PCT Pub. Date: Dec. 20, 2001

(65) Prior Publication Data
US 2003/0164710 A1 Sep. 4, 2003

(30) Foreign Application Priority Data
Jun. 16, 2000 (DE) .......................... 100 29 000
May 29, 2001 (DE) .......................... 101 26 262

(51) Int. Cl.$^7$ .............................................. G01R 31/11
(52) U.S. Cl. ...................................... 324/534; 324/543
(58) Field of Search ................................ 324/533, 543, 324/534

(56) References Cited

U.S. PATENT DOCUMENTS

| 4,630,228 | A | | 12/1986 | Tarczy-Hornoch et al. . 364/576 |
| 5,661,404 | A | | 8/1997 | Yanagawa et al. ........... 324/601 |
| 5,949,236 | A | * | 9/1999 | Franchville .................. 324/533 |
| 5,977,773 | A | * | 11/1999 | Medelius et al. ............ 324/520 |
| 6,177,801 | B1 | * | 1/2001 | Chong .......................... 324/520 |
| 6,437,578 | B1 | * | 8/2002 | Gumm ......................... 324/533 |

FOREIGN PATENT DOCUMENTS

| GB | 2 239 956 | 7/1991 |
| JP | 11-211766 | 8/1999 |
| WO | WO 00/29862 | 5/2000 |

* cited by examiner

Primary Examiner—N. Le
Assistant Examiner—Walter Benson
(74) Attorney, Agent, or Firm—Baker & Daniels

(57) ABSTRACT

A method for measuring fault locations in high frequency cables and lines. A signal with the frequency f0 and a level a0 is emitted from the source. This signal is split up in the splitter and is routed to the same parts in the test piece (DUT=device under test) and to a sink. The signals of the source and the returning wave of the DUT are added, whereby the result of this addition is a signal with the frequency f0 and an amplitude a1. The value of the frequency f0 is changed, and the amplitude of the newly generated sum signal is, in turn, recorded. An inverse Fourier transformation transforms the signals from the frequency domain into the time domain. The transition point, which appears as the defined peak in the time diagram can thereby be located.

5 Claims, 3 Drawing Sheets

METHOD FOR MEASURING FAULT LOCATIONS IN HIGH FREQUENCY CABLES AND LINES

BACKGROUND OF THE INVENTION

The invention relates to a Method for measuring fault locations in high frequency cables and lines.

Measuring fault locations is used, in order to measure the length of cables or to find defective positions in cables.

For this usually a short impulse is sent into the cable to be measured and then the running time, the level and the phase of the reflections of the impulse are measured and evaluated. Such a measurement is also called TDR measurement. However, for this quite complex vector network analyzer systems are necessary, which are quite unmanageable, heavy and therefore are rather used as laboratory instruments.

However, a further variant presents itself as an alternative, which is technically less complex, but requires quite some calculating performance. With this variant a frequency sweep is sent into the cable and the addition of the basic signal and the reflected signal is evaluated in complex calculations, so that a fault location is possible. This variant is also called FDR measurement. The FDR measurement makes use of the fact that frequency information can be converted into the time range by means of a Fourier's transformation (or Fast-Fourier's transformation).

A spectrum analyzer with integrated frequency generator developed by now into a small durable piece of equipment, which proved itself especially in mobile use, is exactly suitable for such an application.

Document U.S. Pat. No. 5,949,236 relates to a method for measuring fault locations in high frequency cables and lines by means of the use of a frequency domain reflectometer. An impedance compensation factor is applied on the measured signals, in order to correct cable impedances of the measuring cable.

The impedance compensation factor is determined by a measurement run with reference impedance. The use of a spectrum analyzer for measuring fault locations is not disclosed.

Document WO-A-00 29862 relates to a method for correcting frequency-dependent and length-dependent line impedances for FDR-measurements carried out on high-frequency cables, during which a compensation function to be applied to a certain cable length for the compensation of the determined impedance course is determined with the help of impedance values provided by the manufacturer.

SUMMARY OF THE INVENTION

The problem to be solved is to provide a method to perform a measuring fault location according to FDR with the data from a spectrum analyzer, while paying special attention to the calibration data and their application.

This is solved by the method including the following steps:
a) Emitting a signal with the frequency f0 and a level a0 from a signal source,
b) Splitting of the signal in a power splitter and routing of the signal in equal parts into a test piece DUT and to a sink,
c) Measuring of the added signal of the source and the returning wave of the DUT with the frequency f0 and an amplitude a1 at the sink and storing of the amplitude a1, assigned to the frequency f0, in an array zd( ),
d) Changing the frequency f0 with a given frequency value dF and repeating of the steps a)–d) until the frequency f0 reaches a given cutoff frequency,
e) Applying of an inverse Fourier's transformation to the measured values ad( ) and storing of the results in an array ztd( )
f) Determining the location of transition points, while taking the shortening factor into account.

It is insignificant in what form the calculation steps of the method are accomplished, how the data is supplied to the method and how the results of the method are represented. EXCEL (software of the company Microsoft) was primarily used during the development of the method, but it is also conceivable to create the method as its own software, which can then also effect the control of the analyzer, or to implement it directly into the analyzer.

Favorable design variations and improvements of the method according to the invention are described below.

BRIEF DESCRIPTION OF THE DRAWINGS

The invention is described hereinafter in more detail with the help of a design example in reference to the drawings. Further features, advantages, and areas of application of the invention will be apparent from the drawings and their description.

DETAILED DESCRIPTION

All rules of the Fast Fourier's transformation, of the complex calculation and of the basics of numeric mathematics apply.

Figure 1:
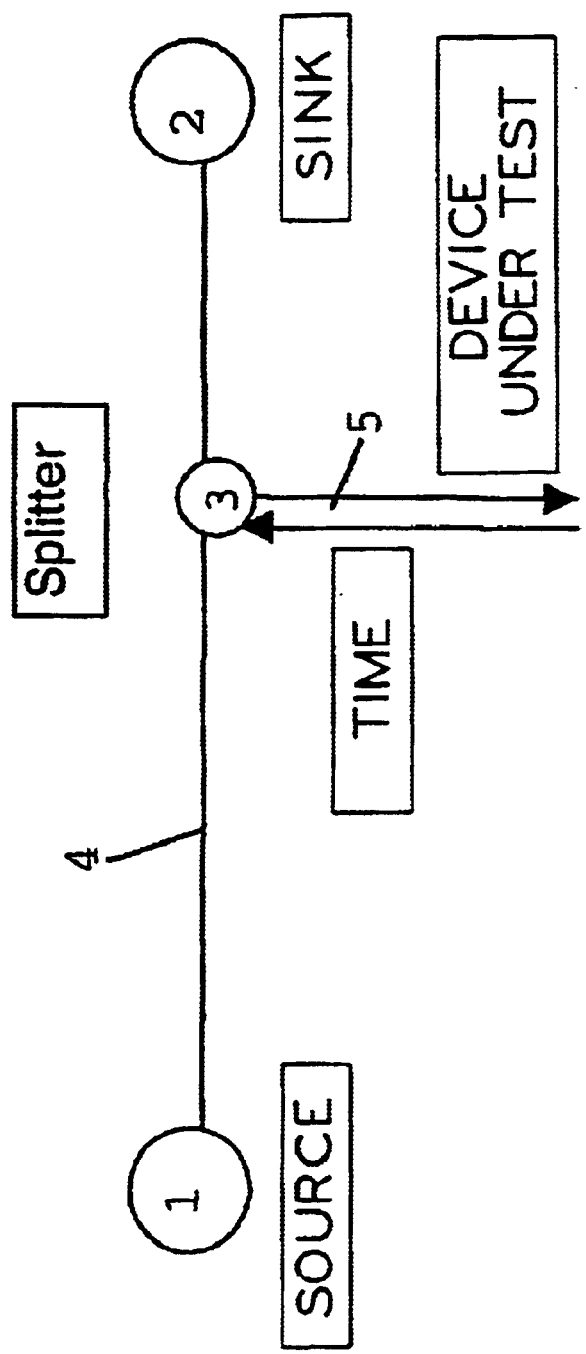
FIG. 1 shows schematically a possible design of the measurement equipment for the implementation of the method.

The design of the measuring equipment is shown schematically in FIG. 1. There is provided a source 1 (the signal generator), which can produce any adjustable frequency, a power splitter 3 as a coupling element, which realizes in each direction an adjustment of 50 Ohm, and a sink 2 (voltmeter), which can measure the voltages of a signal with the frequency f.

A signal with the frequency f0 and a level a0 is sent from the signal source 1 into a measuring cable 4. This signal is divided in the splitter 3 and passed on in equal parts into the test piece 5 (DUT=Device under Test) and to the sink 2.

If one assumes the fact that at the end of the DUT 5 a total reflection is present, a stationary wave will be formed on the DUT. If one assumes now further that the power splitter 3 concentrates on one point, the signals of the source 1 and of the returning wave of the DUT 5 are added at exactly this point.

The result of this addition is a signal with the frequency f0 and an amplitude a1, which is a function of the addition and depends on the kind of reflection (capacitive/inductive), the length l of the DUT and the reflection factor. This signal can be measured at the sink 2. However, the result achieved up to now is not yet sufficient to determine the fault location. If now the frequency f0 is changed in its value and the amplitude of the newly created added signal is recorded and if this is repeated in a suitable range (span), one will be able to recognize that the measured values of the amplitude of the added signal resembles to a great extent a sinusoidal oscillation, whereby it here of course refers to a sinusoidal oscillation in the frequency range i.e. the measured values of the frequency.

Once this point is reached a Fourier's transformation is applied to exactly these measured values, which changes the time range into the frequency range and vice versa. It is to be expected that the transformation (analogous to the transformation of a sinusoidal oscillation from a time range into the frequency range) creates a distinctive peak in the time range. As expected, the peak represents the time which is necessary for a wave to run from the splitter 3 to the point of reflection and back again.

The transition point can thus be found, with consideration of the shortening factor, in its location. The amplitude value of the peak permits beyond that an indication about the reflection factor. If the peak is very high, it is a strong reflection.

Herewith now the foundation is built in order to accomplish with the described method a fault location determination.

Configuration of the Spectrum Analyzer:

For the implementation of the method a spectrum analyzer is used. The analyzer must have a tracking generator and should be adjustable in its resolution (points per sweep). Only a power splitter (impedance in each direction of 6 dB) is needed as the external component, which connects the output of the tracking generator with the input of the analyzer and the DUT. The center frequency is to be adjusted in such a way that the utilizable frequency of the DUT is used for the measurement and that it permits the span range, which is decisive for the cable length to be measured and the resolution.

Following are the substantial adjustments of the analyzer:
Measuring point:
Number:
  A multiple of $2^x$, thus 2, 4, 8, 16 . . . ; 256, 512, 1024 etc.
  A good compromise is 512.
  If the value is not adjustable, only a number of $2^x$ points (because of the FFT) is usable

| Y-amplitudes adjustment: | | | |
|---|---|---|---|
| Scaling: | Linear | | |
| Ref level: | 200 mV | | |
| Frequency adjustment: | | | |
| Center frequency: | Utilizable frequency to the measuring DUT | | |
| Span: | Dependent on the length to be measured and the number of the measuring points (see also below) | | |
| Span. Examples: | 700 Mhz | smaller than 25 m | with 512 measuring points |
| | 300 Mhz | smaller than 60 m | with 512 measuring points |
| | 100 Mhz | smaller than 190 m | with 512 measuring points |
| Tracking generator: | | | |
| Power level: | 200 mV | | |
| Averaging: | | | |
| Video Averaging: | 10 | | |

All other parameters, such as measuring range, sweep time etc. should be adjusted according to the automatic defaults of the analyzer, since this way the optimum performance of the analyzer can be achieved.

Implementation of the Measurement:

After the analyzer has been adjusted and the wiring has been done, the measurement can be started.

For this a measuring cable (lead cable) should be switched between the DUT and power splitter 3, which, like the power splitter and the measuring system themselves, is calibrated out. However, it is to be made certain that the turned on components (splitter, lead cable, connecting cable, transitions) are in good condition and correspond to the z-value of the system.

The measurement consists of two calibration measurements, which are then followed by any number of object measurements.

A calibration measurement is a SHORT at the end of the lead cable.

The second calibration measurement is a LOAD at the end of the lead cable.

Method for the FDR:

Preparation and transformation of the frequency range into the time range:

Starting point for the following mathematical transition point definition are the three series of measurements $as(\ )$ [Short], $al(\ )$ [Load] and $ad(\ )$ [DUT]

with an array size of $2^x$ measuring points each.

These three series of measurements can also be represented in a complex notation $\{z:=a+bi\}$, whereby the imaginary part of the series of measurement is always assumed to be 0:

$zs(\ ):=as(\ )+0i$ $zl(\ ):=al(\ )+0i$ $zd(\ ):=ad(\ )+0i$

The following observations assume that an array begins with the index 0. In order to increase the resolution within the range of strong transition points, it is possible to submit the series of measurements to a WIDOWING. A simple window (window) is a cosine-roll-off-window, thus a cosine function, which has been inverted, then the value 1 added, then halved and that covers the range 0 to $2*PI$ for the measuring points 0 to $(2^x-1)$.

Window $(index)=0.5*(1-COS(index*2*PI/(2^x-1)))$ for index $[0$ to $2^x-1]$

Each measuring point of the arrays is multiplied now with the equivalent measuring point of the cosine window and written back again into the array.

Naturally also all other window functions are possible.

In the following is assumed that the measured values, windowed or not, are present in the arrays $zs(\ )$, $zl(\ )$ and $zd(\ )$.

On each of these complex series of measurements now the inverse Fast Fourier's transformation (iFFT) is implemented, which produces as the result a complex array with $2^x$ points (for each series of measurements).

$$zts(\ ):=iFFT\,[zs(\ )]$$

$$ztl(\ ):=iFFT\,[zl(\ )]$$

$$ztd(\ ):=iFFT\,[zd(\ )]$$

The first element of the array represents the DC voltage portion of the series of measurements and is excluded for all further observations.

A FFT supplies $2^x$ points as result, it refers however to a result series, with $2^{(x-1)}$ points, which is mirrored.

Therefore it is sufficient for all further observations to regard the array up to the index $(2^{(x-1)})-1$.

For this reason, now the arrays zts( ), zd( ) and ztd( ) are limited to the indices $(1 \ldots (2^{(x-1)}-1)$.

Standardization on SHORT

From the results in the series zts( ) it is known that a short is at the end of the lead cable. Therefore it is to be expected that in the time range a distinctive maximum value is to be found, which represents exactly the end of this lead cable and thus the SHORT.

In the array $(2 \ldots (2^{(x-1)}-1)$ (it is begun with the index 2, since after a windowing the peak increases in the width, which applies also to the DC voltage portion) this maximum value is now looked for and if it is found, both the value and the index are extracted. The index, at which the maximum was found, is called (max), so that the value of this point can be designated with zts(max).

The complex value zts(max) is now converted into the absolute value (amount) (abs{ }) and its argument (phase) (arg{ }).

The following rules of the complex calculation apply:
With z:=a+bi follows $$abs\{z\}=sqr(a^2+b^2)\text{ and}$$

$$arg\{z\}=arctan(b/a)$$

Since this measured value is a SHORT, one can work with the following assumption:
A short is a reflection with the value 1 and with a phase displacement of 180° (pi).

Suitable factors and addends are now found for the values abs{zts(max)} and arg{zts(max)}, which are designated as follows:

$$korabs=1/(abs\{zts(\text{max})\})$$

$$korarg=pi+arg\{zts(\text{max})\}$$

It is now a goal to correct the measured values of all series of measurements with these factors and to receive therefore defined conditions related to a SHORT at the end of the lead cable.

For this the transformation into absolute value and argument for each element of the series of measurements must first be accomplished.

Thereupon the standardization follows according to the form:

$$abs\{zt\_k(\ )\}:=korabs*abs\{zt\_(\ )\}$$

$$arg\{zt\_k(\ )\}:=korarg-arg\{zt\_(\ )\}$$

The underscoring represents for s (Short), l (load) and d (DUT).

From the appropriate arrays for absolute value and argument following again complex arrays are created, whereby the following interrelationship applies:

$$zt\_k(\ ):=[abs\{zt\_k(\ )\}*\cos\,(arg\{zt\_k(\ )\}]+[abs\{zt\_k(\ )\}*\sin\,(arg\{zt\_k(\ )\})]i$$

The first standardization is thereby accomplished.

The produced absolute values correspond now to the unit UNITS, a value common in circles of network analyzers, which makes a statement over the adjustment and allows a conversion into dB in the following way:

Adjustment $[dB]=20*\log(\text{UNITS})\rightarrow1$ unit=0 $dB$, 0.01 unit $=-40$ $dB$ Standardization on LOAD Up to this point, only the phases and amounts of the measurements are adapted, therefore standardized. If one assumes that the measuring system is an ideal system, that is in this system always adjustment optimal prevails and thus no reflections are produced, surely no further standardization is necessary.

In a real system however this is not the case, because internal reflections can create several problems and quickly cause faulty measurements if they are not eliminated.

Now one cannot eliminate reflections, one can however do a mathematical back calculation, which determines these errors of the measuring system determined and then corrects them within the measurement.

Following now this correction is described in more detail.

From the results of the series ztik( ) it is known that there is a Load at the end of the lead cable. All values in the time range should apply within this measurement as an ideal measurement, thus not exhibiting reflections and transition points. In a real system one can very probably recognize however such fault locations, which represent however only the errors of the actual measuring system.

Such errors are in the later measurement however of no value and therefore have to be eliminated there. This takes place by means of the fact that the measured values ztlk( ) are subtracted from the measured values ztdk( ) in a complex calculation.

This creates a new series of measurements, which obeys the following relationship:

$$ztdkk(\ ):=ztdk(\ )\times ztlk(\ )$$

It is important to implement this subtraction in the complex way, since it is only ensured this way that only the system errors are eliminated and that defective locations in the object remain further recognizable, since the phase information is available as an additional indicator.

In the array ztdkk( ) the amplitude-corrected and error-corrected measured values of the measuring object are now contained.

Insertion of Cable Data

Up to this point all cable-specific data such as impedance and shortening factor were irrelevant. For the next step however these values are of great importance.

First the incrementation per measuring point is determined by means of the shortening factor.

For this the following formula is used:

$$St:=((Vc*c)/Sp)/2$$

Vc:=VelocityFactor (shortening factor [0 . . . 1])
c:=speed of light with approx. 299, 792, 458 m/sec (in vacuum)
Sp:=span range in Mhz (measuring span)
St:=steps in the unit meter
Imped:=cable impedance in the unit dB/m
From this one can now calculate with the formula $$MaxDist:=(\text{Number Measuring points}/2)*St$$

the maximum distance, which can be indicated.

The number of measuring points must be halved for this, since the iFFT is mirrored at the center of the array.

It is however very problematic to use this entire range of values, since it is likewise a characteristic of iFFT that strong peaks can appear again as harmonics in the process of the series of measurements. This is quite problematic if a large transition point is present at the end of the measuring object, which re-occurs in a weakened form at the double measuring distance through the iFFT (approx. 30 dB weaker) and is mirrored back into the measuring range by the above mentioned mirror behavior of the iFFT. A misinterpretation of the measurement is then the inevitable result.

For this reason it is necessary to reduce the usable measuring range again by half and to eliminate as far as possible these mirror images from the observation space of the measured values.

$$NutzDist:=(\text{Number Measuring points}/4)*St[\text{see above}]$$

With the help of the preceding information it is now possible to process and represent the data.

Each measuring point can be assigned with the formula $$Dist:=\text{Index}*St$$

a clear distance, which is helpful in the diagram. Besides that it should be the goal to represent only the measured values starting from the index (max) since all measured values before that represent only the lead cable and the measuring system. Furthermore the impedance course of the cable starting from the point index (max) must be calculated out, in order to be able to securely determine correct adjustment values even at larger distances. An array Dist( ) is created, which contains (NutzDist) values.

On the basis of the array Dist( ) now an array AmpKor( ) is created according to the following formula:

$$AmpKor(\ ):=10^{\wedge}((2*Dist(\ )*Imped)/20)$$

whereby the value Imped indicates the impedance of the cable in dB per meter.

The factor 2, with which the Dist( ) is multiplied, is necessary, since the wave passes the cable once forward and once backward and thereby the cable impedance has to be considered twice.

The array ztdkk( ) is now shifted in such a way, that the index (0) receives the value index (max), index (1) receives the value index (max+1) and so on.

This way the irrelevant data of the measuring system are removed so that only measuring data of the object are present and a direct interrelationship between the arrays ztdkk( ), AmpKor( ) and Dist( ) can be established.

The absolute values abs{ztdkk( )} are now multiplied with the correction values of AmpKor( ) and represented in a diagram together with the values of Dist( ).

On the y-axis now the unit UNIT will be found as an indicator of the reflection and on the x-axis the unit METER will be found as an indicator over the distance. The representation of the y-axis can take place also logarithmically, in order to make a better resolution of strong and weak transition points possible.

Determination of Cable Impedances

As is can be easily recognized, the center frequency played so far no role during the actual measuring of the fault location. As already mentioned above, however, the measurement is to be made in the same frequency range, in which also the object is operated. With the correct determination of the cable impedance, the center frequency now however plays a substantial role, since it is strongly dependent on the used frequency range.

Usually the cable impedance is indicated for 1 GHz, which also covers all other frequency ranges, which however leads to substantial measuring errors depending upon the cable.

For this reason a method is provided, with which it is possible, to determine the cable impedance for any frequency within a range, without possessing a reference value for exactly this point.

For this the following preliminary considerations are made:

The cable impedance is plotted in logarithmic scale, similar to an e-function, a fact which is due to the losses of the dielectric which do not behave linearly over the frequency range.

The function can be copied within a finite frequency range with a formula that has a cubic form.

The supporting locations for the determination of the formula may not be equidistant.

There is a method, which by means of four supporting locations can create a formula of the form $$p(x)=a*x^{\wedge}3+b*x^{\wedge}2+c*x+d$$

that also fulfills the condition to go exactly through the values of the supporting locations. This method is called: Interpolation by polynomials according to Newton The method is particularly suitable for use with computer technology. Even if the supporting locations do not have to be equidistant, it is however very much recommended to partition the frequency range as evenly as possible in order to increase the integrity of the formula.

Furthermore the formula should not be used beyond the two benchmark figures, since the formula becomes inaccurate quickly within this range.

Practical application supporting locations at 170 Mhz, 450 Mhz, 900 Mhz and 1800 Mhz proved themselves well, whereby the formula can be used then within the range of 170 Mhz to 1800 Mhz.

Following a computer-technical variant is to be shown, which creates the polynomial as described.

Creation of the Polynomial:

```
anz=4              *** number of supporting places
redim x1(anz)      *** frequency values (in logarithmic form)
redim y1(anz)      *** coefficients of the created polynomial
redim y2(anz)      *** impedance values at the supporting locations
x1(1) = log10(170/100)    *
x1(2) = log10(450/100)    ** Logarithmization of the frequencies
x1(3) = log10(900/100)    **
x1(4) = log10(1800/100)   *
y2(1) = value 1 at 170 Mhz    *
y2(2) = value 2 at 450 Mhz    ** assigning the specific supporting
                                 locations
y2(3) = value 3 at 900 Mhz    ** to the frequencies with the unit dB/m
y2(4) = value 4 at 1800 Mhz   *
*** run and runa are only index variables, which are used
*** within loops
Creation of the coefficient:
for run = 2 to anz
    for runa = run to anz
        y2 (runa) = (y1(runa)-y1(runa-1))/(x1(runa)-x1(runa-run+1))
    next runa
    for runa = run to anz
        y1(runa) = y2(runa)
    next runa
next run
for run = 1 to anz-1
```

```
                        -continued for runa = anz-1 to run step-1
        y1(runa) = y1(runa) + (y1(runa+1)*-x1(runa-run+1))
        next runa
next run
Use of the polynomial:
Input"Frequency in Mhz (170 Mhz-1800 Mhz) =",f
xp=log10(f/100)
y=0
for run = anz to 1 step-1
    y=y+y1(run)*xp (run-1)
next run
``` print "The impedance of the cable equals=";y;"dB/m at ";f;"Mhz."

This small BASIC program is to represent a possibility of the creation of the polynomial, which worked very well in practical operation.

The preceding observation makes it now possible to calculate for each center frequency the suitable cable impedance (within the supporting locations) and thus to achieve an optimum concerning the cable impedance correction.

Within the SPAN range around the center frequency this cable impedance value is likewise only an approximate value. Since one can assume, however, with relatively small span ranges a linear course of the change of the impedance, this means that a calculation with an average value produces a relatively small error.

Figure 2:
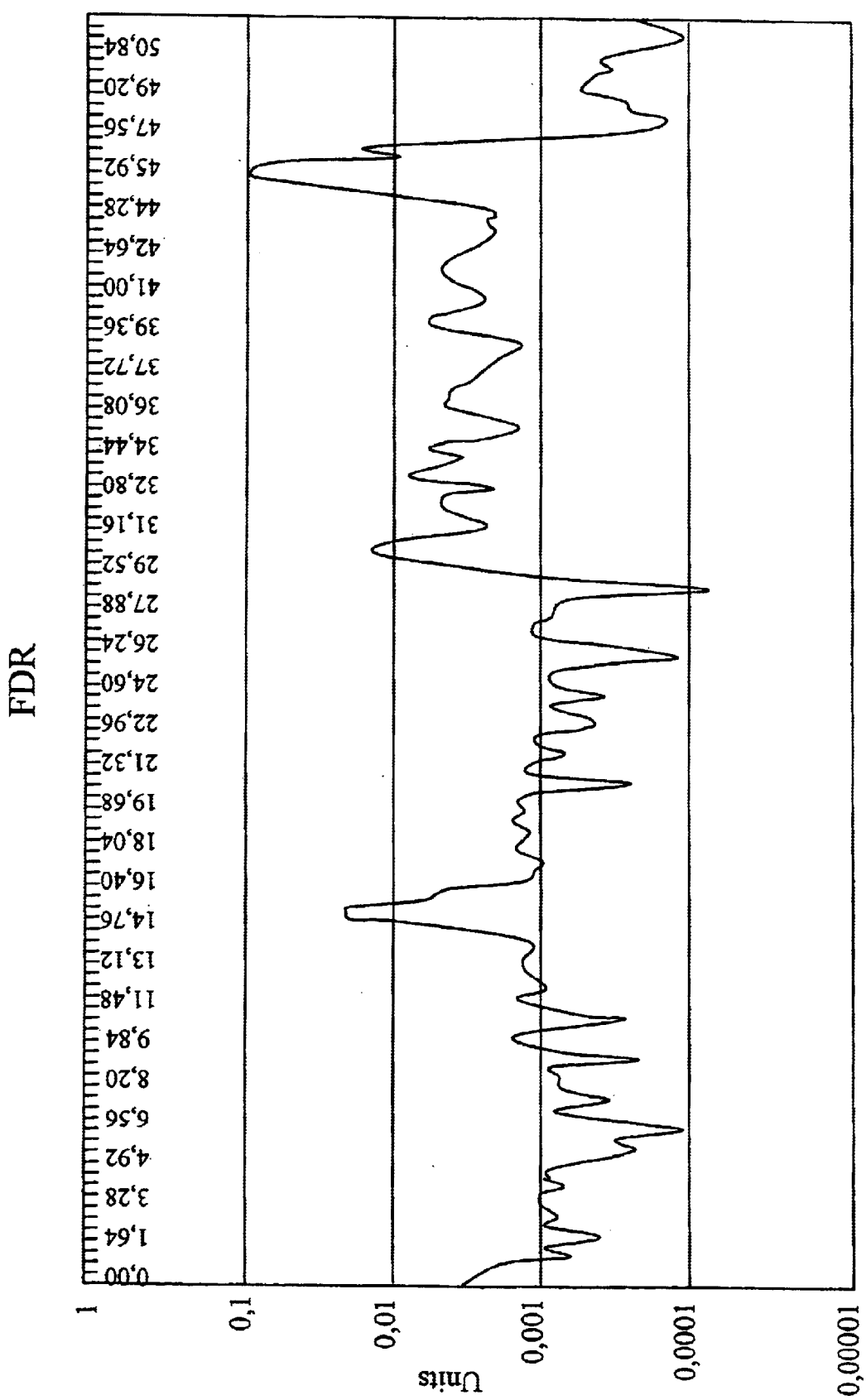
FIG. 2 is a representation of a measuring diagram of a measurement at a line consisting of three interconnected cables which are in each case 15 m long and false conclusion with s=1.2 at the end of the line.

In the measuring diagram according to FIG. 2 one can recognize a line made from three connected cables with a length of 15 m each, which is finished with a false conclusion with a value of s=1.2. The false conclusion can be clearly recognized as a strong peak for a running length of 45 m. The last cable (range from 30–45 m) was in the past stressed a lot and exhibits therefore somewhat worse adjustment values than the two first cables. The measurement was accomplished at 1200 Mhz, what explains the relatively high reflection values of the transitions between the cables with running lengths of 15 m and 30 m. The measuring dynamics are here for instance 55 dB, enough to be able to surely recognize transition points with an adjustment of 40 dB.

Figure 3:
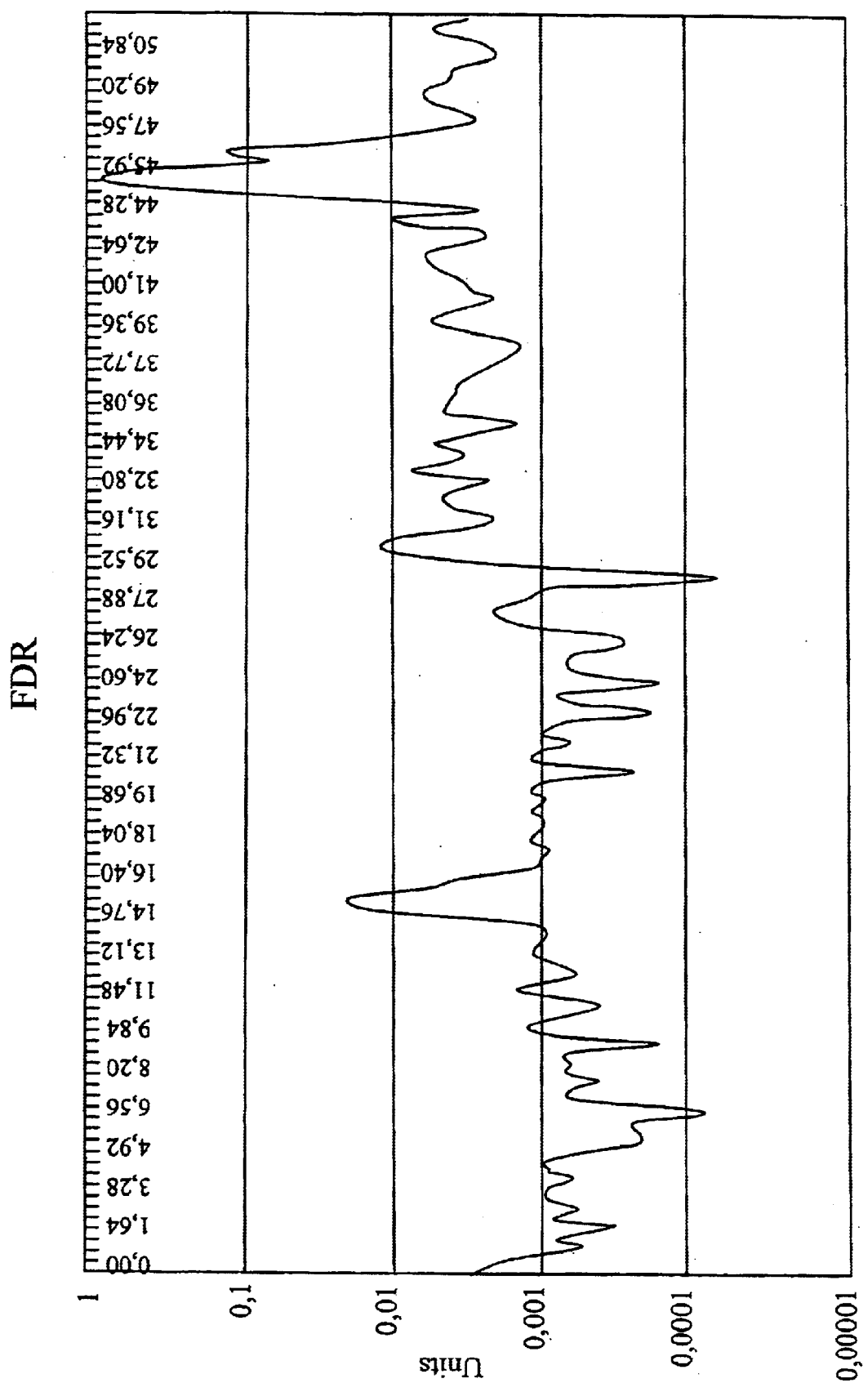
FIG. 3 is a representation of a measuring diagram of a measurement of a line consisting of three interconnected cables which are in each case 15 m long and have an open cable end.

The measurement according to FIG. 3 shows the same arrangement of cables and transitions, as the preceding diagram in FIG. 2. The only difference to be seen is the conclusion at the end of the cable, which exhibits a reflection factor of approx. 1, i.e. it is an open end. Thus a very high peak with the value 1 results in the case of a running length of 45 m. It is clear that the measuring dynamics can be used in their entirety, without being able to recognize a qualitative loss of the measured values.

The method for the error location determination with spectrum analyzers, described above, possesses the advantage of high measuring dynamics (better 50 dB) with minimal calibration expenditure. The accuracy of the measurement results could be confirmed by many tests. The necessary calculation requirement is at the same time easy to survey and can be mastered without difficulty by modern computer systems.

What is claimed is:

1. A method for measuring fault locations in high frequency cables and lines, including the following steps:

(a) performing a first calibration measurement with a SHORT at the end of the measuring cable, storing the measured values in an array as( ), submitting the measured values to an inverse Fourier's transformation and storing in an array zts( ), (b) performing a second calibration measurement with a LOAD at the end of the measuring cable, storing the measured values in an array zl( ), submitting the measured values to an inverse Fourier's transformation and storing in an array ztl( ), (c) emitting a signal with the frequency f0 and a level a0 from a signal source, (d) splitting the signal in a power splitter and routing the signal in equal parts to a test piece DUT and to a sink, (e) measuring the added signal of the source and the returning wave of the DUT (5) with the frequency f0 and an amplitude a1 at the sink and storing the amplitude a1, assigned to the frequency f0, in an array zd( ), (f) changing the frequency f0 with a given frequency value dF and repeating the steps a)–d) until the frequency f0 reaches a given cutoff frequency, (g) applying an inverse Fourier's transformation to the measured values ad( ) and storing of the results in an array ztd( ), (h) standardizing the measured values of the test piece ztd( ) on the basis of the measured values zts( ) and ztl( ) of the first and second calibration measurements, and (i) determining the location of transition points while taking the shortening factor into account.

2. The method according to claim 1, wherein the measured values ztd( ) are multiplied with a window function window ( ).

3. The method according to claim 2, wherein a cosine-roll-off window is used as window function window ( ).

4. The method according to claim 1, wherein the line impedance and the shortening factor of the test piece are considered in the measured values.

5. The method according to claim 1, wherein the line impedance of the test piece along the measured frequency range is determined by interpolation by means of a cubic polynomial on the basis of a plurality of measuring points.

* * * * *